(12) United States Patent
Rinne

(10) Patent No.: US 6,418,033 B1
(45) Date of Patent: Jul. 9, 2002

(54) MICROELECTRONIC PACKAGES IN WHICH SECOND MICROELECTRONIC SUBSTRATES ARE ORIENTED RELATIVE TO FIRST MICROELECTRONIC SUBSTRATES AT ACUTE ANGLES

(75) Inventor: Glenn A. Rinne, Apex, NC (US)

(73) Assignee: Unitive Electronics, Inc., Durham, NC (US)

(*) Notice: Subject to any disclaimer, the term of this patent is extended or adjusted under 35 U.S.C. 154(b) by 0 days.

(21) Appl. No.: 09/714,311

(22) Filed: Nov. 16, 2000

(51) Int. Cl.⁷ .............................. H05K 1/11; H05K 1/14
(52) U.S. Cl. ................. 361/784; 361/703; 361/715; 361/744; 361/804; 257/685; 257/686; 257/723; 257/724
(58) Field of Search ................. 257/686, 685, 257/723, 724, 737, 738, 777, 696; 361/767, 768, 784, 790, 796, 797, 803, 735, 743, 736, 760, 783, 737, 396; 228/180.21, 180.22

(56) References Cited

U.S. PATENT DOCUMENTS

| | | | |
|---|---|---|---|
| 4,266,282 A | | 5/1981 | Henle et al. ............... 365/52 |
| 5,019,943 A | * | 5/1991 | Fassbender ............... 361/396 |
| 5,227,664 A | * | 7/1993 | Toshio ..................... 257/723 |
| 5,347,428 A | | 9/1994 | Carson et al. ............. 361/760 |
| 5,432,729 A | | 7/1995 | Carson et al. ............. 365/63 |
| 5,793,116 A | | 8/1998 | Rinne et al. ............... 257/777 |
| 5,892,179 A | | 4/1999 | Rinne et al. ............... 174/261 |
| 5,963,793 A | | 10/1999 | Rinne et al. ............... 438/107 |
| 5,990,472 A | | 11/1999 | Rinne ...................... 250/214.1 |
| 6,134,120 A | * | 10/2000 | Baldwin ................... 361/804 |
| 6,169,325 B1 | * | 1/2001 | Azuma ..................... 257/685 |

FOREIGN PATENT DOCUMENTS

JP    63099558 A    4/1988

OTHER PUBLICATIONS

Multimedia Card Association, www.mmca.org.
SanDisk Corporation, SanDisk Flash Data Storage, San Disk Compact Flash™ and MultiMediaCard: Small Form Factor Solutions, 1999.

* cited by examiner

*Primary Examiner*—Jayprakash N. Gandhi
*Assistant Examiner*—Michael L. Lindinger
(74) *Attorney, Agent, or Firm*—Myers Bigel Sibley & Sajovec

(57) ABSTRACT

Microelectronic packages include a first microelectronic substrate, a second microelectronic substrate that is oriented at an acute angle relative to the first microelectronic substrate, and first solder bumps between the first and second microelectronic substrates, adjacent an edge of the second microelectronic substrate, that connect the second microelectronic substrate to the first microelectronic substrate and that are confined to within the edge of the second microelectronic substrate. The edge of the second microelectronic substrate is adjacent the vertex of the acute angle. A third microelectronic substrate also may be provided on the first microelectronic substrate that laterally overlaps the second microelectronic substrate. Second solder bumps connect the third microelectronic substrate to the first microelectronic substrate. The second and third microelectronic substrates may be oriented parallel to one another at the acute angle relative to the first microelectronic substrate. Alternatively, second solder bumps are adjacent a first edge of the third microelectronic substrate and opposite a second edge of the third microelectronic substrate, wherein the second edge of the third microelectronic substrate is adjacent the vertex and wherein the first edge of the third microelectronic substrate is opposite the vertex.

57 Claims, 5 Drawing Sheets

MICROELECTRONIC PACKAGES IN WHICH SECOND MICROELECTRONIC SUBSTRATES ARE ORIENTED RELATIVE TO FIRST MICROELECTRONIC SUBSTRATES AT ACUTE ANGLES

FIELD OF THE INVENTION

This invention relates to microelectronic devices and fabrication methods therefor, and more particularly to microelectronic packages and packaging methods.

BACKGROUND OF THE INVENTION

In packaging microelectronic devices such as integrated circuits (also referred to as integrated circuit chips or simply as chips) on printed circuit boards or other integrated circuit mounting substrates, the integrated circuits generally are mounted parallel to and facing the printed circuit board such that a face of the integrated circuit is adjacent a face of the printed circuit board. This packaging technology can allow a large number of input/output connections to be provided between the integrated circuits and the printed circuit board, especially when solder bump technology is used, which can cover the entire face of the integrated circuits with solder bump connections. Unfortunately however, this packaging technology may limit the packaging density, because the large faces of the integrated circuit chips are mounted adjacent the face of the printed circuit board. Moreover, this packaging technology may limit the speed of the integrated circuits due to the relatively long interconnection lines on the printed circuit board.

In order to increase the packaging density of chips on the printed circuit board, three-dimensional packaging technologies also have been proposed, wherein the chips are mounted orthogonal to the circuit board so that a chip edge is adjacent the face of the circuit board. See for example U.S. Pat. No. 4,266,282 to Henle, et al. entitled Vertical Semiconductor Integrated Circuit Chip Packaging; U.S. Pat. No. 5,347,428 to Carson, et al. entitled Module Comprising IC Memory Stack Dedicated to and Structurally Combined with an IC Microprocessor Chip and U.S. Pat. No. 5,432,729 to Carson, et al. entitled Electronic Module Comprising a Stack of IC Chips Each Interacting with an IC Chip Secured to the Stack. In these patents, solder bump technology is used to connect the edges, rather than the faces, of integrated circuit chips to a substrate. Unfortunately, an edge-to-face connection may be difficult and/or costly to produce.

Moreover, in using solder bump technology to interconnect a three-dimensional package, it may be difficult to fabricate the solder bump to bridge from one substrate to another. In particular, it may be difficult to form solder that extends beyond the edge of a chip because the chip sawing or dicing operation may remove or damage the solder that extends beyond the chip edge. Moreover, during solder reflow, it is well known that the solder takes the shape of a hemisphere or partial hemisphere on a contact pad. Thus, it may be difficult to cause the solder on one contact pad to extend onto another contact pad, in a three-dimensional package. Even if solder is placed on pair of adjacent contact pads in a three-dimensional package, it may be difficult to cause the reflowed solder to join up, rather than forming individual solder bumps.

A major advance in three-dimensional microelectronic packaging that uses solder bump technology to interconnect a three-dimensional package is described in U.S. Pat. No. 5,793,116 to the present inventor Rinne, et al. entitled Microelectronic Packaging Using Arched Solder Columns, the disclosure of which is hereby incorporated herein by reference in its entirety. As described therein, a microelectronic package may be formed in which solder bumps on one substrate are expanded, to thereby extend to and contact a second substrate and thereby form a solder connection. In particular, a first microelectronic substrate is oriented relative to a second microelectronic substrate, such than an edge of the second microelectronic substrate is adjacent the first microelectronic substrate. One of the first and second microelectronic substrates includes a plurality of solder bumps thereon, adjacent the edge of the second microelectronic substrate. The plurality of solder bumps are expanded to extend to and contact the other of the first and second microelectronic substrates.

In the above-cited Rinne et al. '116 patent, the plurality of solder bumps may be expanded by reflowing additional solder from an elongated, narrow solder-containing region adjacent the solder bump. into the solder bump. This region also may be referred to as a solder reservoir. Surface tension from the elongated solder-containing region can cause the solder to flow from the elongated solder-containing region into the solder bump, thereby expanding the volume of the solder bump and causing it to extend to and contact the other substrate. The plurality of solder bumps may be formed on the second microelectronic substrate adjacent the edge thereof. The solder bumps are caused to extend laterally beyond the edge of the second microelectronic substrate, to thereby contact the first microelectronic substrate. The solder bumps may be caused to extend laterally by reflowing additional solder into the plurality of solder bumps from the elongated, solder region adjacent the solder bump. Accordingly, solder bumps may be caused to bridge a gap to extend onto and contact an adjacent pad.

This breakthrough technology also is described in U.S. Pat. No. 5,892,179 to the present inventor Rinne, et al. entitled Solder Bumps and Structures for Integrated Redistribution Routing Conductors; U.S. Pat. No. 5,963,793 to the present inventor Rinne, et al. entitled Microelectronic Packaging Using Arched Solder Columns and U.S. Pat. No. 5,990,472 to the present inventor Rinne entitled Microelectronic Radiation Detectors for Detecting and Emitting Radiation Signals. The disclosures of all of these patents are hereby incorporated herein by reference in their entirety.

SUMMARY OF THE INVENTION

Microelectronic packages according to embodiments of the present invention include a first microelectronic substrate, a second microelectronic substrate that is oriented at an acute angle relative to the first microelectronic substrate, and a plurality of first solder bumps between the first and second microelectronic substrates, adjacent an edge of the second microelectronic substrate, that connect (electrically and/or mechanically) the second microelectronic substrate to the first microelectronic substrate and that are confined to within the edge of the second microelectronic substrate. The edge of the second microelectronic substrate is adjacent the vertex of the acute angle.

In other embodiments, a third microelectronic substrate also may be provided on the first microelectronic substrate that laterally overlaps the second microelectronic substrate. A plurality of second solder bumps connect the third microelectronic substrate to the first microelectronic substrate. In some embodiments, the second and third microelectronic substrates are oriented parallel to one another at the acute angle relative to the first microelectronic substrate. In other embodiments, the plurality of second solder bumps are adjacent a first edge of the third microelectronic substrate and opposite a second edge of the third microelectronic substrate, wherein the second edge of the third microelectronic substrate is adjacent the vertex and wherein the first edge of the third microelectronic substrate is opposite the vertex.

Embodiments of the present invention stem from a realization that if integrated circuits are mounted on a printed circuit board at an acute angle rather than perpendicular thereto, the acute angle may be limited so that the solder bumps can bridge from the integrated circuit to the printed circuit board without the need to expand the solder bumps during reflow. Accordingly, solder reservoirs. which can be difficult and/or costly to produce, need not be used for three-dimensional packaging. Moreover, by allowing multiple integrated circuit dies to laterally overlap on the printed circuit board, an increase in packaging density and/or reduced signal path lengths can be obtained compared to conventional mounting of integrated circuits on printed circuit boards. In particular, integrated circuit chips may be nested within one another so as to allow a small form factor.

Embodiments of microelectronic packages according to the invention can include a first microelectronic substrate and a second microelectronic substrate that is oriented at an acute angle relative to the first microelectronic substrate. The acute angle includes a vertex. A plurality of first solder bumps extend between the first and second microelectronic substrates, adjacent an edge of the second microelectronic substrate at the vertex of the acute angle, to connect the second microelectronic substrate to the first microelectronic substrate. The plurality of solder bumps are confined to within the edge of the second microelectronic substrate. A third microelectronic substrate also is oriented at the acute angle relative to the first microelectronic substrate, parallel to and laterally overlapping the second microelectronic substrate. A plurality of second solder bumps also extend between the first and third microelectronic substrates. adjacent an edge of the second microelectronic substrate at the vertex of the acute angle. The plurality of second solder bumps electrically and mechanically connect the third microelectronic substrate to the first microelectronic substrate and are confined to within the edge of the third microelectronic substrate. The second and third microelectronic substrates preferably are free of solder reservoir connections to the respective plurality of first and second solder bumps. Stated differently, sub-hemispherical, rather than super-hemispherical, solder bumps may be formed.

According to other embodiments, a plurality of integrated circuits are located on an integrated circuit mounting substrate, such as a printed circuit board. The plurality of integrated circuits are oriented parallel to each other and at an acute angle relative to the integrated circuit mounting substrate. Each of the integrated circuits includes first and second opposing faces and first and second opposing edges, wherein the first faces and the first edges are adjacent the integrated circuit mounting substrate and the second faces and second edges are opposite the integrated circuit mounting substrate. A plurality of solder bumps on the first faces adjacent the first edges of the integrated circuits extend between the integrated circuits and the integrated circuit substrate, and also extend to adjacent the first face of an adjacent integrated circuit. The respective first faces of the integrated circuits may rest upon the respective second faces of a respective adjacent integrated circuit. In other embodiments, the integrated circuits are identical integrated circuits, and in other embodiments the identical integrated circuits are flash memory integrated circuits. The acute angles may be as described above, and the integrated circuits and the integrated circuit mounting substrate may be free of solder reservoir connections.

In other embodiments of microelectronic packages according to the present invention, a second microelectronic substrate is oriented at an acute angle relative to the first microelectronic substrate. The acute angle includes a vertex. A plurality of first solder bumps extend between the first and second microelectronic substrates, adjacent a first edge of the second microelectronic substrate that is adjacent the vertex, to connect the second microelectronic substrate to the first microelectronic substrate. A third microelectronic substrate is provided on the first microelectronic substrate that extends between the second microelectronic substrate and the first microelectronic substrate. A plurality of second solder bumps are located adjacent a first edge of the third microelectronic substrate, and opposite a second edge of the third microelectronic substrate. The second solder bumps connect the third microelectronic substrate to the first microelectronic substrate, such that the second edge of the third microelectronic substrate is adjacent the vertex and the first edge of the third microelectronic substrate is opposite the vertex. In first embodiments, the plurality of first and second solder bumps are confined to within the respective first and second edges of the respective second and third microelectronic substrates. In other embodiments they need not be so confined.

Other embodiments of microelectronic packages according to the present invention include a first microelectronic substrate and a second microelectronic substrate having first and second opposing edges and canted on the first microelectronic substrate such that the first edge is spaced further away from the first microelectronic substrate than the second edge. A third microelectronic substrate is provided on the second microelectronic substrate, opposite the first microelectronic substrate and extending in a first direction onto the second microelectronic substrate towards the first edge and in a second direction that is opposite the first direction away from and beyond the second microelectronic substrate. A plurality of first solder bumps may be provided adjacent the first edge that electrically and mechanically connect the second microelectronic substrate to the first microelectronic substrate. A plurality of second solder bumps also may be provided in non-overlapping relationship with the second microelectronic substrate that electrically and mechanically connect the third microelectronic substrate to the first microelectronic substrate. The second microelectronic substrate preferably is free of solder bumps adjacent the second edge and the third microelectronic substrate preferably is free of solder bumps that overlap the second microelectronic substrate. In other embodiments, the second and third microelectronic substrates are identical integrated circuit chips. In other embodiments they are identical integrated circuit memory chips such as flash memory chips.

Other embodiments of microelectronic packages according to the present invention include an integrated circuit mounting substrate, and first and second integrated circuits on the integrated circuit mounting substrate, each of which includes first and second opposing faces and first and second opposing edges, wherein the first faces are adjacent the integrated circuit mounting substrate and the second faces are opposite the integrated circuit mounting substrate. A plurality of solder bumps on the first faces and adjacent the first edges of the first and second integrated circuits extend between the first and second integrated circuits and the integrated circuit mounting substrate. The first and second integrated circuits are oriented on the integrated circuit mounting substrate, such that the second integrated circuit is canted towards the integrated circuit mounting substrate from the first edge to the second edge thereof, and the first face of the second integrated circuit extends on the second face of the second integrated circuit. In first embodiments, the second edge of the second integrated circuit rests on the second face of the first integrated circuit. In other embodiments, the first face of the second integrated circuit rests on the second edge of the first integrated circuit. The integrated circuits may be identical, free of solder reservoir connections and/or mounted at the angles described above.

Microelectronic packaging methods according to embodiments of the present invention orient a second microelectronic substrate at an acute angle relative to a first microelectronic substrate such that a plurality of solder bumps extend between the first and second microelectronic substrates, adjacent an edge of the second microelectronic substrate. The plurality of solder bumps are reflowed to electrically and mechanically connect the second microelectronic substrate to the first microelectronic substrate while confining the plurality of solder bumps to within the edge of the second microelectronic substrate during the reflow. Other embodiments orient a third microelectronic substrate on the first microelectronic substrate to laterally overlap the second microelectronic substrate such that a plurality of second solder bumps electrically and mechanically connect the third microelectronic substrate to the first microelectronic substrate. The plurality of second solder bumps then are reflowed during the reflowing step.

In other method embodiments, the second and third microelectronic substrates are oriented parallel to one another at the acute angle relative to the first microelectronic substrate. In yet other method embodiments, the second microelectronic substrate is oriented such that the edge of the second microelectronic substrate is adjacent the vertex and the third microelectronic substrate is oriented such that a plurality of second solder bumps are adjacent a first edge of the third microelectronic substrate and opposite a second edge of the third microelectronic substrate, the second edge of the third microelectronic substrate is adjacent the vertex and the first edge of the third microelectronic substrate is opposite the vertex. In first embodiments reflowing takes place without increasing the plurality of solder bumps in volume. In other embodiments reflowing may take place while increasing the plurality of solder bumps in volume.

DETAILED DESCRIPTION OF PREFERRED EMBODIMENTS

Figure 1:
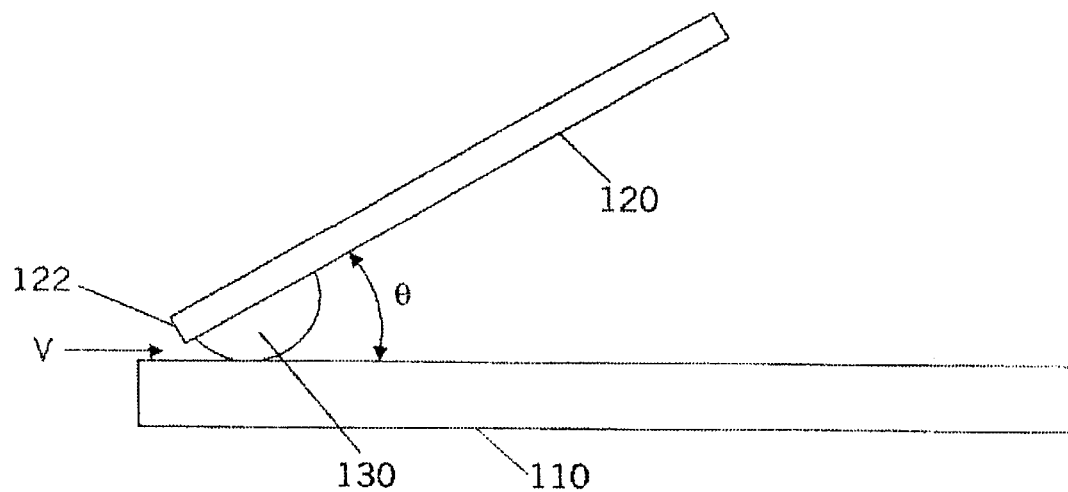
FIGS. 1–4 are cross-sectional views of microelectronic packages and packaging methods according to embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Also, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Referring now to FIG. 1, a cross-sectional view of microelectronic packages and packaging methods according to embodiments of the present invention is shown. As shown in FIG. 1, these embodiments include a first microelectronic substrate 110 and a second microelectronic substrate 120 that is oriented at an acute angle $\theta$ relative to the first microelectronic substrate 110.

The first microelectronic substrate 110 may be an integrated circuit mounting substrate such as a printed circuit board, multilayer ceramic board, glass ceramic board, a glass substrate and/or other substrate, and may also be a semiconductor substrate such as a wafer or integrated circuit die. Since the term "printed circuit board" is widely used to generically refer to integrated circuit mounting substrates, the first substrate 110 also may be referred to herein as a printed circuit board 110.

The second microelectronic substrate 120 may be an integrated circuit chip and/or multi-chip module but also may be discrete components and/or other packaging substrates such as printed circuit boards and the like. Since integrated circuit chips are commonly mounted on printed circuit boards the second substrate 120 also may be referred to herein as an integrated circuit chip, an integrated circuit or simply a chip 120.

Continuing with the description of FIG. 1, a plurality of solder bumps 130 are located between the first and second microelectronic substrates 110 and 120 adjacent an edge 122 of the second microelectronic substrate. The solder bumps connect (electrically and/or mechanically) the second microelectronic substrate 120 to the first microelectronic substrate 110. The design and fabrication of solder bumps are well known to those having skill in the art and need not be described further herein.

As also shown in FIG. 1, the solder bumps 130 are confined to within the edge 122 of the second microelectronic substrate 120. Stated differently, the solder bumps 130 do not extend laterally on the face of the second microelectronic substrate 120, beyond the edge 122. Thus, as shown in FIG. 1, the second microelectronic substrate 120 is oriented at an acute angle relative to the first microelectronic substrate 110 so that greater packing density may be obtained compared to second microelectronic substrates that are oriented parallel to the first microelectronic substrate. However, the acute angle $\theta$ is selected so that the solder bumps 130 may be confined to the edge of the second microelectronic substrate. Stated differently, the solder bumps are sub-hemispherical rather than super-hemispherical. Accordingly, solder reservoirs and/or other techniques need not be used to extend the solder bumps 130 beyond the edge 122. A derivation of preferred angles θ will be described in detail below. As will be described below angle θ preferably is less than about 60° and more preferably is about 25°. Accordingly, these acute angles can allow a conventional hemispherical or sub-hemispherical solder bump to touch the first substrate 110 without expansion. The solder bumps need not be located at the very edge of the die but may be offset from the edge. It also will be understood that if solder paste is applied to the substrate 110 prior to placement, as may be done in Direct Chip Attach (DCA), the solder bump size and/or location requirements may be further relaxed because the solder bump on the second substrate may not melt or change in shape.

Microelectronic packages of FIG. 1 may be fabricated by orienting a second microelectronic substrate 120 at an acute angle θ relative to a first microelectronic substrate 110 such that a plurality of solder bumps 130 extend between the first and second microelectronic substrates adjacent an edge 122 of the second microelectronic substrate. The solder bumps may be formed on the first microelectronic substrate and/or the second microelectronic substrate using conventional solder bump fabrication techniques that need not be described in detail herein.

Then, the plurality of solder bumps 130 are reflowed to connect the second microelectronic substrate 120 to the first microelectronic substrate 110, preferably while confining the plurality of solder bumps to within the edge 122 of the second microelectronic substrate during the reflowing. Thus, higher density packing and/or reduced signal path length may be obtained without the need to increase the plurality of solder bumps in volume during reflow. Accordingly, solder reservoirs and their potential complexity, cost and/or area penalty need not be provided.

Figure 2:
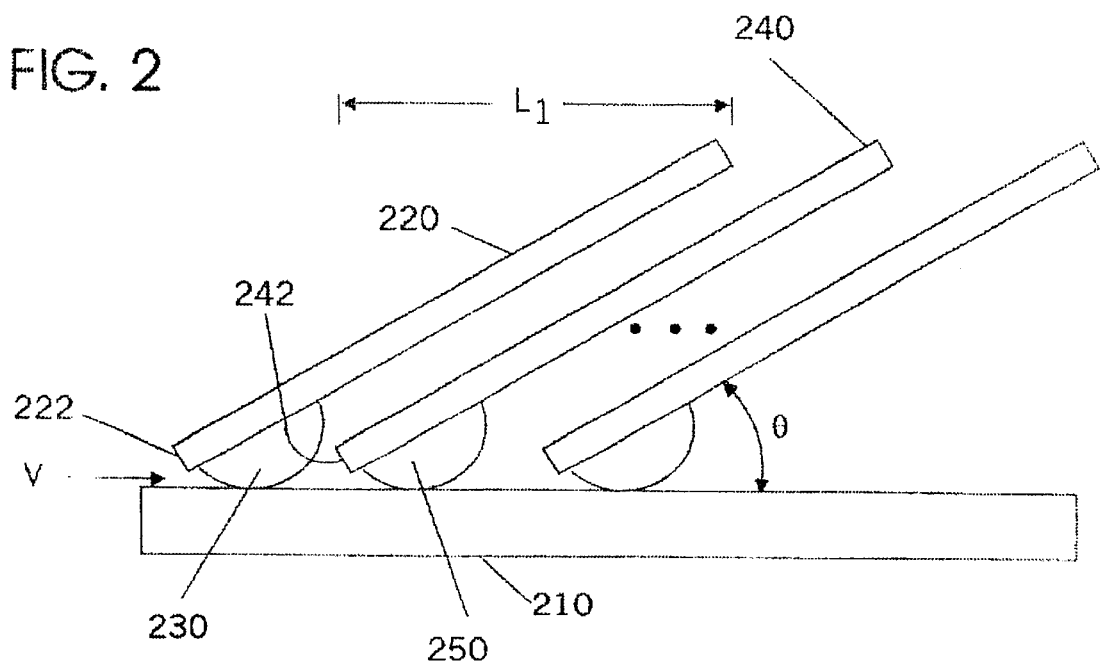

FIG. 2 is a cross-sectional view of other embodiments of microelectronic packages and packaging methods according to embodiments of the present invention. As shown in FIG. 2, these embodiments include a first microelectronic substrate 210, a second microelectronic substrate 220 that is oriented at an acute angle θ relative to the first microelectronic substrate and a plurality of solder bumps 330 that are confined to within the edge 222 of the second microelectronic substrate, similar to the first and second microelectronic substrates 110 and 120, the solder bumps 130 and the edge 122 of FIG. 1, and need not be described in detail again. As shown in FIG. 2, a third microelectronic substrate 240 also is provided on the first microelectronic substrate 210 that laterally overlaps the second microelectronic substrate 220. This lateral overlap is indicated by the distance L1. A plurality of second solder bumps 250 electrically and mechanically connect the third microelectronic substrate 240 to the first microelectronic substrate 210. As shown in the embodiments of FIG. 2. the second and third microelectronic substrates 220 and 240 are parallel to and spaced apart from one another at the acute angle θ relative to the first microelectronic substrate 210. The plurality of second solder bumps 250 are between the first and third microelectronic substrates 210 and 240, adjacent an edge 242 of the third microelectronic substrate 240 and are confined to within the edge 242 of the third microelectronic substrate 240. The acute angle θ includes a vertex V and the edge 242 of the third microelectronic substrate is adjacent the vertex. As also shown in FIG. 2, additional microelectronic substrates may be provided.

The second and third microelectronic substrates 220 and 240 may be identical microelectronic substrates such as identical integrated circuit chips and more particularly identical integrated circuit memory chips such as flash memory chips. Integrated circuit flash memory chips may be particularly suitable because they may only include a row of solder bumps adjacent one edge thereof. It also will be understood that any or all of the second, third and other microelectronic substrates that are oriented at the acute angle relative to the first microelectronic substrate, may be different from one another, and the acute angles need not be the same.

The second and third microelectronic substrates 220 and 240 also may be regarded as a plurality of second microelectronic substrates. Microelectronic packages of FIG. 2 may be fabricated, according to embodiments of the invention, by orienting a plurality of second microelectronic substrates 220 and 240 in spaced apart parallel relationship to one another and at an acute angle θ relative to a first microelectronic substrate 210 such that the adjacent second microelectronic substrates 220 and 240 laterally overlap on the first microelectronic substrate 210 and such that a plurality of solder bumps 230 and 250 extend between the first microelectronic substrate 210 and each of the second microelectronic substrates 220 and 230 adjacent an edge 222 and 242 of the respective second microelectronic substrates at the vertex V of the acute angle θ. The solder bumps 230 and 250 may be formed on the second microelectronic substrates and/or on the first microelectronic substrate.

Then, the plurality of solder bumps 230 and 250 are reflowed to electrically and mechanically connect the second microelectronic substrates to the first microelectronic substrate, preferably while confining the plurality of solder bumps to within the respective edges of the respective second microelectronic substrates during the reflow. Conventional reflowing techniques may be used. However, preferably the reflowing does not expand the solder bumps 230 and 250 in volume.

Figure 3:
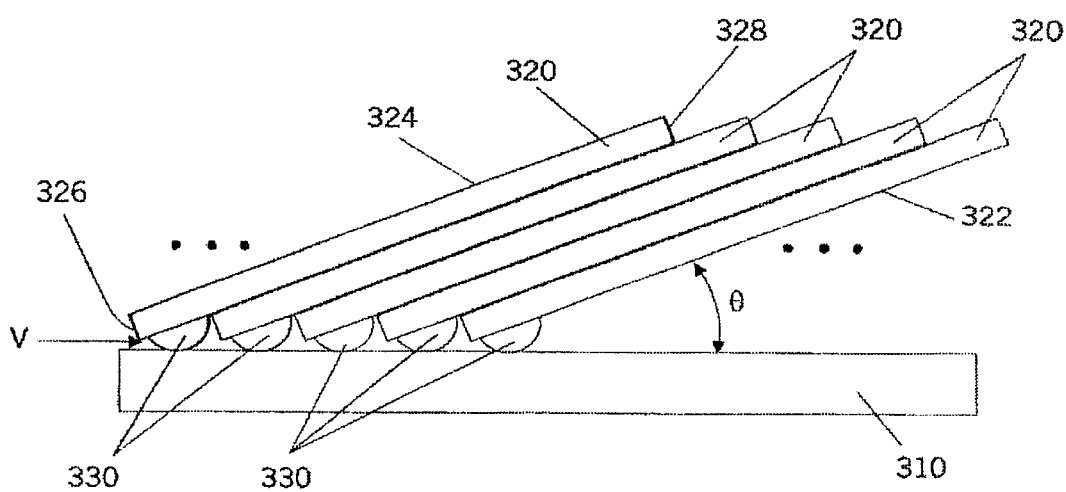

Referring now to FIG. 3, other microelectronic packages and packaging methods according to embodiments of the present invention are shown. In FIG. 3, a plurality of integrated circuits 320 are mounted on an integrated circuit mounting substrate 310 such as a printed circuit board and are oriented parallel to each other and at an acute angle θ relative to the integrated circuit mounting substrate 310. As shown, each of the integrated circuits 320 includes first and second opposing faces 322 and 324 respectively, and first and second opposing edges 326 and 328, respectively, wherein the first faces 322 and the first edges 326 are adjacent the integrated circuit mounting substrate 310 and the second faces 324 and second edges 328 are opposite the integrated circuit mounting substrate 310. A plurality of solder bumps 330 also are included on the first faces 322, and adjacent the first edges 326 of the integrated circuits, that extend between the integrated circuits 320 and the integrated circuit substrate, and extend to adjacent the first face 322 of an adjacent integrated circuit 320.

As also shown in FIG. 3, a respective first face 322 of an integrated circuit rests upon a respective second face 324 of an adjacent integrated circuit. It also will be understood that although only five integrated circuits 320 are shown in FIG. 3, any number of integrated circuits may be included. As described above, the integrated circuits may be identical integrated circuits and/or flash memory integrated circuits, free of solder bumps adjacent the second edges 328 and/or free of solder reservoir connections. It also will be understood that the integrated circuits 320 and the integrated circuit mounting substrate 310 may be embodied as any microelectronic substrates, as was described above. The solder bumps 330 preferably are confined within the first edge of the respective integrated circuits. The angle θ may be as described above.

Microelectronic packages of FIG. 3 may be fabricated according to embodiments of the present invention by orienting the integrated circuits 320, solder bumps 330 and integrated circuit mounting substrate 310, as shown in FIG. 3, and reflowing the solder. Prior to reflowing the solder, the last (rightmost in FIG. 3) integrated circuit 330 may need to be supported so that it does not fall. The other integrated circuits also may need to be supported.

Figure 4:
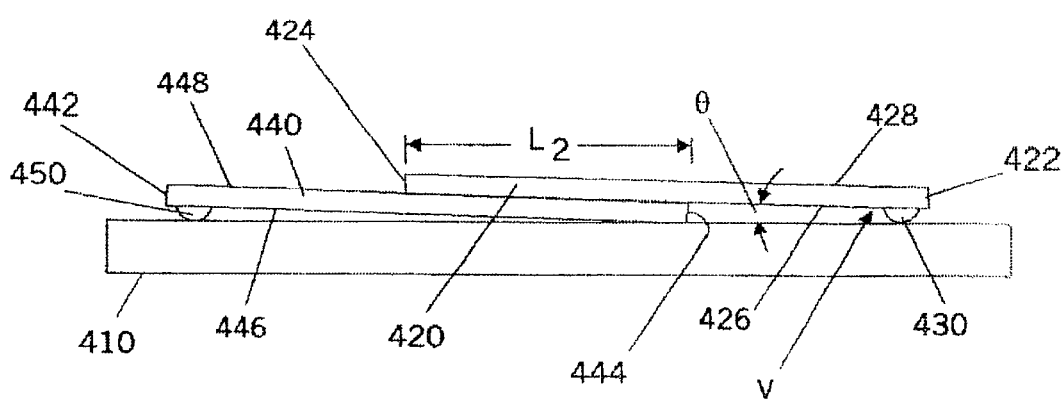

FIG. 4 is a cross-sectional view of yet other microelectronic packages and packaging methods according to embodiments of the present invention. As shown in FIG. 4, these embodiments include a first microelectronic substrate 410, a second microelectronic substrate 420 that is oriented at an acute angle θ relative to the first microelectronic substrate 410 and a plurality of solder bumps 430 between the first and second microelectronic substrates. The first and second substrates may be embodied as was already described and need not be described again. As shown in FIG. 4, an edge 422 of the second microelectronic substrate 420 is adjacent the vertex V. As also shown in FIG. 4, a third microelectronic substrate 440 also is provided on the first microelectronic substrate 410 that laterally overlaps the second microelectronic substrate 420 by an amount L2. A plurality of second solder bumps 450 also is provided that connect the third microelectronic substrate 440 to the first microelectronic substrate 410.

More specifically, as shown in FIG. 4, the plurality of second solder bumps 450 are adjacent a first edge 442 of the third microelectronic substrate 440, and opposite a second edge 444 of the third microelectronic substrate 440. The plurality of second solder bumps 450 connect the third microelectronic substrate 440 to the first microelectronic substrate 410. The second edge 444 of the third microelectronic substrate is adjacent the vertex V and the first edge 442 of the third microelectronic substrate 440 is opposite the vertex V. The second and third microelectronic substrates 420 and 440 may be parallel to one another as shown. However, they need not be parallel to one another, as will be described in detail below.

Embodiments of FIG. 4 also may be regarded as including a third microelectronic substrate 440 having first and second opposing edges 442 and 444 and canted on the first microelectronic substrate 410 such that the first edge 442 is spaced further away from the first microelectronic substrate 410 than the second edge 444. A second microelectronic substrate 420 is located on the third microelectronic substrate 440, opposite the first microelectronic substrate 410. The second edge 444 of the third microelectronic substrate 440 is adjacent the vertex V and the first edge 442 of the third microelectronic substrate 440 is opposite the vertex V.

Microelectronic packages according to embodiments of FIG. 4 may be fabricated by canting a third microelectronic substrate 440 on a first microelectronic substrate 410 such that a first edge 442 is spaced further away from the first microelectronic substrate 410 than the second edge 444 thereof. A second microelectronic substrate 420 is oriented on the third microelectronic substrate 440 opposite the first microelectronic substrate 410 such that the second microelectronic substrate 420 extends in a first direction (shown as left in FIG. 4) onto the third microelectronic substrate 440 towards the first edge 442 and in a second direction that, is opposite the first direction (shown as right in FIG. 4) away from and beyond the third microelectronic substrate 440. The second and third microelectronic substrates then are soldered to the first microelectronic substrate.

It will be understood that in embodiments of FIG. 4, the first and second plurality of solder bumps 430 and 450 may be confined to within the respective first edges 422 and 442 of the respective second and third microelectronic substrates 420 and 440 during reflowing. The first and second solder bumps also preferably do not increase in volume during reflowing. However, in other embodiments, the first and second plurality of solder bumps 430 and 450 may extend beyond the respective edges 422 and/or 442 and/or may increase in volume.

Microelectronic packages according to FIG. 4 also may be regarded as including an integrated circuit mounting substrate 410 and first and second integrated circuits 420 and 440 on the integrated circuit mounting substrate, each of which includes first 426, 446 and second 428, 448 opposing faces and first 422, 442 and second 424, 444 opposing edges. The first faces 426, 446 are adjacent the integrated circuit mounting substrate 410 and the second faces 428, 448 are opposite the integrated circuit mounting substrate 410. These embodiments also may be regarded as including a plurality of solder bumps 430, 450 on the first faces 426, 446 and adjacent the first edges 422, 442 of the first and second integrated circuits 420, 440 that extend between the first and second integrated circuits and the integrated circuit mounting substrate. Finally, these embodiments also may be regarded as having the first and second integrated circuits oriented on the integrated circuit mounting substrate, such that the second integrated circuit 440 is canted toward the integrated circuit mounting substrate 410 from the first edge 442 to the second edge 444 thereof, and the first face 426 of the second integrated circuit 420 extends on the second face 448 of the second integrated circuit 440, and may rest directly thereon.

Embodiments of FIG. 4 may be particularly suitable for a memory module package that can produce, for example, low-cost, high-yield, multimedia card modules, for example, for flash memories. Multimedia cards are presently marketed by SanDisk and others and are described, for example, at www.mmca.org. The flash memories may be, for example, flash memory chips marketed by Sandisk that are described in product specification 8-56-00072R1, December 1999 and which may be found at http:\\www.sandisk.com\download\mmc.cf2.pdf.

Figure 5:
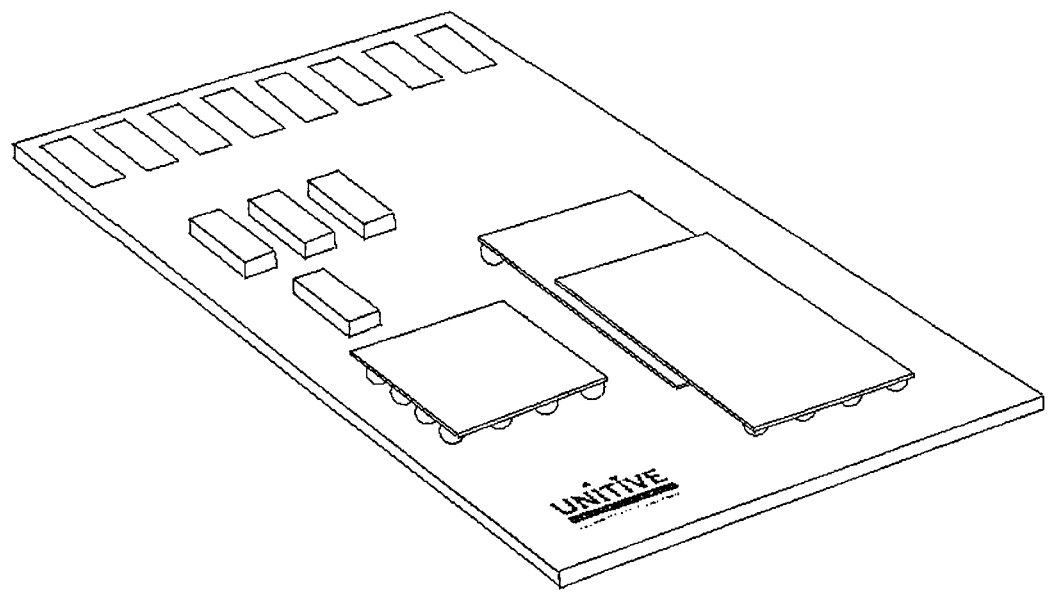
FIG. 5 is a perspective view of multimedia card modules according to embodiments of the present invention.

A perspective view of embodiments of multimedia card modules according to embodiments of the invention is shown in FIG. 5. A shown, these modules may contain three integrated circuits and other passive or discrete components in a package that is 1.4 millimeters thick. Microelectronic packages and packaging methods according to embodiments of the present invention can allow two large flash memory chips to be stacked using solder bumps that are located along one edge thereof. A third integrated circuit chip, the controller, can be flip-chip mounted using an array of solder bumps.

In fabricating this package, electroplating may be used to form solder bumps on the chips in wafer form. After dicing, the chips may be placed on the printed circuit board with the passive or discrete components and all solder joints may be formed by mass reflow. Post reflow solvent cleaning can be used to prepare the assembled device for injection molding of a case. As was described above in connection with FIG. 4, the memory chips may be stacked by placing one chip on the printed circuit board with the solder bumps resting on solder pads of the board. Since there are bumps on one edge only, the chip can rest with the opposite edge against the printed circuit board. The second chip is placed on top of the first with the solder bumps on a second set of solder pads.

Figure 6:
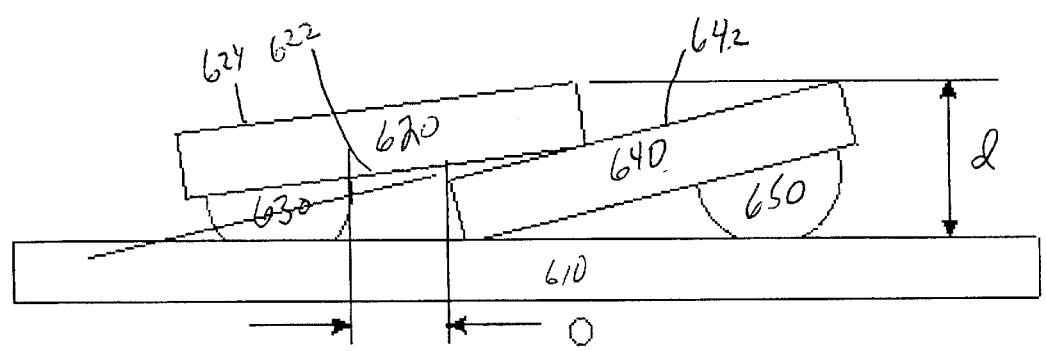
FIG. 6 is another cross-sectional view of microelectronic packages and packaging methods according to embodiments of the invention.

FIG. 6 is another cross-sectional view of microelectronic packages according to embodiments of the invention to illustrate how packaging techniques according to embodiments of the present invention can meet stringent height requirements for a microelectronic package. More specifically, FIG. 6 is a cross-sectional view of first, second and third microelectronic substrates 610, 620 and 640, including first and second rows of solder bumps 630 and 650 configured as was described for substrates 410, 420 and 440 and solder bumps 430 and 450 of FIG. 4. As shown in FIG. 6, the third microelectronic substrate 640 includes an outer face 642 that is opposite the first microelectronic substrate 610 and the second microelectronic substrate 620 includes an inner face 622 that rests on the outer face 642 of the third substrate 640, and an outer face 624 that is opposite the inner face 622. The outer face 624 of the second substrate 620 extends a distance d from the first microelectronic substrate 610. The offset O between the first and second microelectronic substrates 620 and 640 may be selected such that the outer face 624 of the second substrate 620 extends from the first microelectronic substrate 610 by a distance that is less than or about equal to the distance d.

Figure 7:
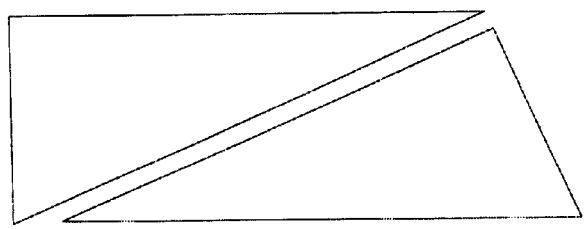
FIG. 7 is a cross-sectional view of an equivalent geometry of the embodiments of FIG. 6.

In embodiments using flash memory chips as described above, the height specification of 1.4 millimeters may be met by backgrinding the integrated circuit chips 620 and 640 to a thickness of about 0.2 mm. The chips may only be supported along one edge so that the lower chip 640 is canted towards the printed circuit board 610 leaving room for the upper chip 620 to lay on top, even when the chip thickness is greater than the bump height. Because the lower chip 640 is canted and the upper chip does not completely overlap the lower, the total height d can be less than the sum of the two chip thicknesses plus one solder bump. This may be visualized using the equivalent geometry of FIG. 7. With bumps along one edge, the bumped chip has a triangular cross-section. The two chips overlap as shown in FIG. 7.

Figure 8:
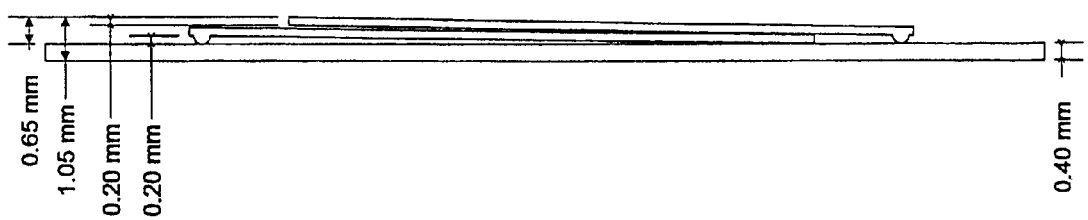
FIG. 8 is another cross-sectional view of integrated circuit packages and packaging methods according to embodiments of the present invention.

FIG. 8 is another embodiment that is proportional to actual dimensions of the integrated circuit chip. Dimensions of the bumps, chip and total package are shown.

By using solder bump technology, self-alignment may be obtained during reflow, which can greatly reduce the placement variance. It therefore is possible to place chips within 0.1 mm of an adjacent chip. Depending on the area that is used for the controller and the discrete or passive components, it also may be possible to fit two stacks of memory chips in the package.

Conventional flash memory integrated circuits include input/output pads, for example as 28 input/output pads, in a single row along one edge thereof. Low input/output density can allow the expanding solder bumps of above-cited U.S. Pat. Nos. 5,793,116, 5,892,179, 5,963,793 and 5,990,472 to be used so that solder can be plated in a pattern that can create large bumps from very thin solder plating. This can provide reduced cost due to increased plating throughput and/or thinner resist templates. The location of the bumps along a single edge also can relax the need for bump height uniformity and can reduce and preferably eliminate the need for expensive fountain plating equipment. Inexpensive batch plating preferably can be used to allow a reduction in capital cost and/or cycle time.

The final passivation on the wafers preferably conforms to guidelines such that the longest dimension of the bond pad openings is 0.020 mm smaller than the solder bump diameter. The solder bumps typically have a diameter that is half the bond pad pitch. It may also be desirable for the bond pad opening sidewalls to have a positive slope to provide a solid base for the bump.

A detailed analysis of preferred angles θ now will be provided, according to embodiments of the invention. In particular, variation of the angle θ generally changes the height, length and volume of the resulting module. The dimensions of the module generally will be a function of the chip size and number of chips, in addition to the angle θ. A derivation of an optimal chip-to-substrate angle θ now will be provided. In the example provided below, the chip is 8 mm long, 12 mm wide and 0.25 mm thick. There are 32 chips in the module.

Figure 9:
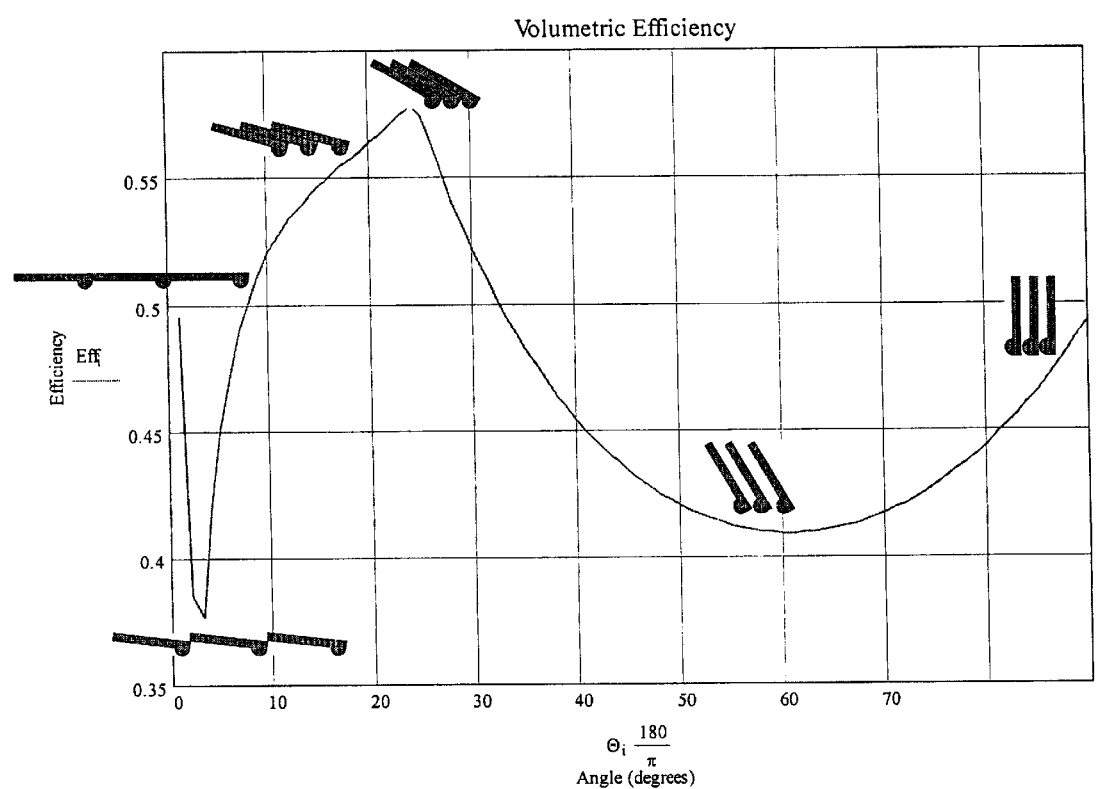
FIG. 9 graphically illustrates volume efficiency as a function of angle $\theta$ according to embodiments of the present invention.

From a density perspective, an ideal case would be no wasted space. The ideal volume for this ideal case is assumed to be 1. FIG. 9 graphically illustrates volume efficiency as a function of angle θ according to embodiments of the present invention. In FIG. 9, efficiency is normalized relative to the ideal efficiency of value 1. At various locations on the curve, a rough sketch of the orientation of the chips (corresponding to second substrates 120, 220 or 320, for example) is shown.

Referring now to FIG. 9, the curve starts at an angle θ of 0°, meaning the chips are parallel to the integrated circuit mounting substrate. In this case, the efficiency is 50%, because the wasted space under the chips is about equal to the space occupied by the substrate area. Thus, this can represent a thinnest module configuration but also represents the longest module configuration.

As the angle θ continues to increase from 0°, the height of the module increases. However, at small angles, the length does not decrease because the die still cannot overlap laterally. Therefore, the efficiency tends to drop.

Further increases in the angle θ from the minimum (about 3° in FIG. 9) allows the chips to overlap, which generally improves the efficiency, until a maximum occurs at about 25° in this example. At this point, the only wasted space need be the triangular space beneath the leftmost chip, the triangular space above the rightmost chip, and some small spaces at the top and bottom of the stack. Since adding more chips would increase the board space but add very little wasted space, the efficiency generally depends on the number of chips. The angle θ at which the maximum occurs also generally is a function of the geometry of the die.

As the angle θ increases beyond the maximum efficiency, shown as about 25° in the example of FIG. 9, the bumps no longer fit under the end of the adjacent die and additional space is used for clearance. Thus, space is left between the chips, which decreases efficiency to another local minimum at about 60°. Finally, as the angle θ approaches 90°, the triangular space at either end of the stack decreases in extent, and the efficiency increases to a local maximum at 90°. This represents the tallest yet shortest module configuration.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A microelectronic package comprising:
   a first microelectronic substrate;
   a second microelectronic substrate that is oriented at an acute angle relative to the first microelectronic substrate; and a plurality of solder bumps between the first and second microelectronic substrates, adjacent an edge of the second microelectronic substrate, that directly connect the second microelectronic substrate to the first microelectronic substrate and that are confined to within the edge of the second microelectronic substrate.

2. A microelectronic package according to claim 1 wherein the acute angle includes a vertex and wherein the edge of the second microelectronic substrate is adjacent the vertex.

3. A microelectronic package according to claim 1 wherein the plurality of solder bumps is a plurality of first solder bumps, the microelectronic package further comprising:
  a third microelectronic substrate on the first microelectronic substrate that laterally overlaps the second microelectronic substrate; and
  a plurality of second solder bumps that directly connect the third microelectronic substrate to the first microelectronic substrate.

4. A microelectronic package according to claim 3 wherein the second and third microelectronic substrates are oriented parallel to one another at the acute angle relative to the first microelectronic substrate.

5. A microelectronic package according to claim 4 wherein the plurality of second solder bumps are between the first and third microelectronic substrates, adjacent an edge of the third microelectronic substrate and are confined to within the edge of the third microelectronic substrate.

6. A microelectronic package according to claim 5 wherein the acute angle includes a vertex and wherein the edge of the third microelectronic substrate is adjacent the vertex.

7. A microelectronic package according to claim 3 wherein the acute angle includes a vertex, wherein the edge of the second microelectronic substrate is adjacent the vertex, wherein the plurality of second solder bumps are adjacent a first edge of the third microelectronic substrate and opposite a second edge of the third microelectronic substrate, wherein the second edge of the third microelectronic substrate is adjacent the vertex and wherein the first edge of the third microelectronic substrate is opposite the vertex.

8. A microelectronic package according to claim 7 wherein the second edge of the third microelectronic substrate is between the first and second microelectronic substrate.

9. A microelectronic package according to claim 3 wherein the third microelectronic substrate extends between the first and second microelectronic substrates.

10. A microelectronic package according to claim 3 wherein the second microelectronic substrate rests upon the third microelectronic substrate.

11. A microelectronic package according to claim 4 wherein the acute angle is less than about 60°.

12. A microelectronic package according to claim 11 wherein the acute angle is about 25°.

13. A microelectronic package according to claim 7 wherein the acute angle is less than about 60°.

14. A microelectronic package according to claim 13 wherein the acute angle is about 25°.

15. A microelectronic package according to claim 1 wherein the second microelectronic substrate is free of solder reservoir connections to the plurality of solder bumps.

16. A microelectronic package according to claim 15 wherein the first microelectronic substrate also is free of solder reservoir connections to the plurality of solder bumps.

17. A microelectronic package comprising:
a first microelectronic substrate;
a second microelectronic substrate that is oriented at an acute angle relative to the first microelectronic substrate, the acute angle including a vertex;
a plurality of first solder bumps between the first and second microelectronic substrates, adjacent an edge of the second microelectronic substrate at the vertex of the acute angle, that directly connect the second microelectronic substrate to the first microelectronic substrate and that are confined to within the edge of the second microelectronic substrate;
a third microelectronic substrate that is oriented at the acute angle relative to the first microelectronic substrate, parallel to and laterally overlapping the second microelectronic substrate; and
a plurality of second solder bumps between the first and third microelectronic substrates, adjacent an edge of the second microelectronic substrate at the vertex of the acute angle, that directly connect the third microelectronic substrate to the first microelectronic substrate and that are confined to within the edge of the third microelectronic substrate.

18. A microelectronic package according to claim 17 wherein the acute angle is less than about 60°.

19. A microelectronic package according to claim 18 wherein the acute angle is about 25°.

20. A microelectronic package according to claim 17 wherein the second and third microelectronic substrates are free of solder reservoir connections to the respective plurality of first and second solder bumps.

21. A microelectronic package according to claim 20 wherein the first microelectronic substrate also is free of solder reservoir connections to the plurality of solder bumps.

22. A microelectronic package according to claim 17 wherein the second microelectronic substrate rests upon the third microelectronic substrate.

23. A microelectronic package comprising:
a first microelectronic substrate;
a second microelectronic substrate that is oriented at an acute angle relative to the first microelectronic substrate, the acute angle including a vertex;
a plurality of first solder bumps between the first and second microelectronic substrates, adjacent a first edge of the second microelectronic substrate that is adjacent the vertex, that connect the second microelectronic substrate to the first microelectronic substrate;
a third microelectronic substrate on the first microelectronic substrate that extends between the second microelectronic substrate and the first microelectronic substrate; and
a plurality of second solder bumps adjacent a first edge of the third microelectronic substrate and opposite a second edge of the third microelectronic substrate that connect the third microelectronic substrate to the first microelectronic substrate, wherein the second edge of the third microelectronic substrate is adjacent the vertex and wherein the first edge of the third microelectronic substrate is opposite the vertex.

24. A microelectronic package according to claim 23 wherein the plurality of first and second solder bumps are confined to within the first edges of the respective second and third microelectronic substrates.

25. A microelectronic package according to claim 23 wherein the second edge of the third microelectronic substrate is between the first and second microelectronic substrate.

26. A microelectronic package according to claim 23 wherein the second microelectronic substrate rests upon the third microelectronic substrate.

27. A microelectronic package according to claim 23 wherein the acute angle is less than about 60°.

28. A microelectronic package according to claim 27 wherein the acute angle is about 25°.

29. A microelectronic package according to claim 23 wherein the second and third microelectronic substrates both are free of solder reservoir connections to the plurality of first and second solder bumps.

30. A microelectronic package according to claim 29 wherein the first microelectronic substrate also is free of solder reservoir connections to the plurality of first and second solder bumps.

31. A microelectronic package comprising:
    a first microelectronic substrate;
    a second microelectronic substrate having first and second opposing edges and canted on the first microelectronic substrate such that the first edge is spaced further away from the first microelectronic substrate than the second edge; and
    a third microelectronic substrate on the second microelectronic substrate, opposite the first microelectronic substrate and extending in a first direction onto the second microelectronic substrate towards the first edge and in a second direction that is opposite the first direction and beyond the second microelectronic substrate.

32. A microelectronic package according to claim 31 further comprising:
    a plurality of first solder bumps adjacent the first edge that connect the second microelectronic substrate to the first microelectronic substrate; and
    a plurality of second solder bumps in non-overlapping relationship with the second microelectronic substrate that connect the third microelectronic substrate to the first microelectronic substrate.

33. A microelectronic package according to claim 32 wherein the second microelectronic substrate is free of solder bumps adjacent the second edge.

34. A microelectronic package according to claim 33 wherein the third microelectronic substrate is free of solder bumps that overlap the second microelectronic substrate.

35. A microelectronic package according to claim 31 wherein the second and third microelectronic substrates are identical integrated circuit chips.

36. A microelectronic package according to claim 32 wherein the second and third microelectronic substrates are identical integrated circuit memory chips.

37. A microelectronic package according to claim 31 wherein the second microelectronic substrate rests upon the third microelectronic substrate, opposite the first microelectronic substrate.

38. A microelectronic package comprising:
    an integrated circuit mounting substrate;
    a plurality of integrated circuits on the integrated circuit mounting substrate that are oriented parallel to each other and at an acute angle relative to the integrated circuit mounting substrate, each of the integrated circuits including first and second opposing faces and first and second opposing edges wherein the first faces and the first edges are adjacent the integrated circuit mounting substrate and the second faces and second edges are opposite the integrated circuit mounting substrate; and
    a plurality of solder bumps on the first faces and adjacent the first edges of the integrated circuits, that directly connect the integrated circuits and the integrated circuit mounting substrate and that are confined to within the first edge of the respective integrated circuits.

39. A microelectronic package according to claim 38 herein a respective first face of an integrated circuit rests upon a respective second face of an adjacent integrated circuit.

40. A microelectronic package according to claim 38 wherein the integrated circuits are identical integrated circuits.

41. A microelectronic package according to claim 40 wherein the integrated circuits are flash memory integrated circuits.

42. A microelectronic package according to claim 38 wherein the first faces are free of solder bumps adjacent the second edges.

43. A microelectronic package according to claim 38 wherein the acute angle is less than about 60°.

44. A microelectronic package according to claim 43 wherein the acute angle is about 25°.

45. A microelectronic package according to claim 38 wherein the integrated circuits are free of solder reservoir connections to the plurality of solder bumps.

46. A microelectronic package according to claim 45 wherein the integrated circuit mounting substrate is free of solder reservoir connections to the plurality of solder bumps.

47. A microelectronic package comprising:
    an integrated circuit mounting substrate;
    first and second integrated circuits on the integrated circuit mounting substrate, each of which includes first and second opposing faces and first and second opposing edges, wherein the first faces are adjacent the integrated circuit mounting substrate and the second faces are opposite the integrated circuit mounting substrate; and
    a plurality of solder bumps on the first faces and adjacent the first edges of the first and second integrated circuits and that extend between the first and second integrated circuits and the integrated circuit mounting substrate;
    the first and second integrated circuits being oriented on the integrated circuit mounting substrate such that the second integrated circuit is canted towards the integrated circuit mounting substrate from the first edge to the second edge thereof and the first face of the first integrated circuit extends on the second face of the second integrated circuit.

48. A microelectronic package according to claim 47 wherein the second edge of the second integrated circuit rests on the second face of the first integrated circuit.

49. A microelectronic package according to claim 47 wherein the first face of the second integrated circuit rests on the second edge of the first integrated circuit.

50. A microelectronic package according to claim 47 wherein the first and second integrated circuits are identical first and second integrated circuits.

51. A microelectronic package according to claim 50 wherein the first and second integrated circuits are flash memory integrated circuits.

52. A microelectronic package according to claim 47 wherein the first faces are free of solder bumps adjacent the second edges.

53. A microelectronic package according to claim 47 wherein the first integrated circuit forms an acute angle of less than about 60° with the integrated circuit mounting substrate.

54. A microelectronic package according to claim 47 wherein the first integrated circuit forms an angle of about 25° with the integrated circuit mounting substrate.

55. A microelectronic package according to claim 47 wherein the first and second integrated circuits are free of solder reservoir connections to the plurality of solder bumps.

56. A microelectronic package according to claim 55 wherein the integrated circuit mounting substrate is free of solder reservoir connections to the plurality of solder bumps.

57. A microelectronic package according to claim 47 wherein the plurality of solder bumps are confined to within the first edges of the first and second integrated circuits.

* * * * *